United States Patent
Rhee et al.

(10) Patent No.: US 7,084,041 B2
(45) Date of Patent: Aug. 1, 2006

(54) BIPOLAR DEVICE AND METHOD OF MANUFACTURING THE SAME INCLUDING PRE-TREATMENT USING GERMANE GAS

(75) Inventors: Hwa-sung Rhee, Seongnam-si (KR); Jae-yoon Yoo, Seoul (KR); Ho Lee, Gyeonggi-do (KR); Seung-hwan Lee, Seoul (KR); Byou-ree Lim, Yongin (KR)

(73) Assignee: Samsung Electronics, Co., Ltd. (KR)

( * ) Notice: Subject to any disclaimer, the term of this patent is extended or adjusted under 35 U.S.C. 154(b) by 136 days.

(21) Appl. No.: 10/795,175

(22) Filed: Mar. 5, 2004

(65) Prior Publication Data

US 2004/0192001 A1     Sep. 30, 2004

(30) Foreign Application Priority Data

Mar. 6, 2003     (KR) .................. 10-2003-0013978

(51) Int. Cl.
  *H01L 21/331* (2006.01)
(52) U.S. Cl. .................. 438/343; 438/488; 438/494
(58) Field of Classification Search ............ 438/343, 438/344, 345, 494
See application file for complete search history.

(56) References Cited

U.S. PATENT DOCUMENTS

| | | | |
|---|---|---|---|
| 5,238,849 A | 8/1993 | Sato | |
| 6,235,568 B1 | 5/2001 | Murthy et al. | 438/231 |
| 6,440,810 B1 * | 8/2002 | Johansson et al. | 438/309 |
| 2002/0132438 A1 * | 9/2002 | Dunn et al. | 438/343 |
| 2003/0080394 A1 * | 5/2003 | Babcock et al. | 257/555 |

FOREIGN PATENT DOCUMENTS

| | | |
|---|---|---|
| JP | 9-7909 | 1/1997 |
| JP | 10012580 | 1/1998 |
| KR | 2000-0018992 | 4/2000 |

* cited by examiner

*Primary Examiner*—Stephen W. Smoot
(74) *Attorney, Agent, or Firm*—Mills & Onello LLP

(57) ABSTRACT

A method of manufacturing a bipolar device including pre-treatment using germane gas and a bipolar device manufactured by the same. The method includes forming a single crystalline silicon layer for a base region on a collector region; and forming a polysilicon layer for an emitter region thereon. Here, before the polysilicon layer is formed, the single crystalline silicon layer is pre-treated using germane gas. Thus, an oxide layer is removed from the single crystalline silicon layer, and a germanium layer is formed on the single crystalline silicon layer, thus preventing Si-rearrangement.

15 Claims, 3 Drawing Sheets

__BIPOLAR DEVICE AND METHOD OF MANUFACTURING THE SAME INCLUDING PRE-TREATMENT USING GERMANE GAS__

This application claims the priority of Korean Patent Application No. 2003-13978, filed on Mar. 6, 2003, in the Korean Intellectual Property Office, the disclosure of which is incorporated herein by reference in their entirety.

BACKGROUND OF THE INVENTION

1. Field of the Invention

The present invention relates to a method of manufacturing a semiconductor device, and more particularly, to a bipolar device and a method of manufacturing the same including pre-treatment using germane ($GeH_4$) gas on a single crystalline silicon layer before formation of a polysilicon emitter region on the single crystalline silicon layer.

2. Description of the Related Art

A bipolar device is a transistor including a collector, a base, and an emitter and functions as a switching device or an amplifier in a logic device. In particular, a bipolar device employed in mobile phones or the like requires high operating speed and stable dispersion of current gains.

FIG. 1 is a schematic cross-sectional view of a typical bipolar device in which an undesired oxide layer is formed. FIG. 2 is a schematic cross-sectional view of a typical bipolar device in which undesired Si-rearrangement occurs.

Referring to FIG. 1, the typical bipolar device comprises a collector region 20 formed on a silicon substrate and a base region 30 and an emitter region (40 of FIG. 2), which are formed on the collector region 20. While the emitter region 40 is formed of a polysilicon layer, the base region 30 is formed of a single crystalline silicon layer. Here, spacers 50 for insulation may be formed on sides of the emitter region 40.

The characteristics of an interface between the emitter region 40 formed of polysilicon and the base region 30 formed of single crystalline silicon affect the operating characteristics of the bipolar device, such as operating speed and/or dispersion of current gains.

More specifically; after forming a single crystalline silicon layer for the base region 30, a spacer layer is formed using silicon nitride on the single crystalline silicon layer. Next, the spacer layer is patterned so as to form a contact hole 51 exposing a portion of the base region 30 formed of single crystalline silicon. Here, an undesired oxide layer 60, i.e., a natural oxide layer or a residual oxide layer, may remain on the exposed portion of the base region 30.

If a polysilicon layer for the emitter region (40 of FIG. 2) is formed on this oxide layer 60, contact resistance between the polysilicon layer for the emitter region 40 and the single crystalline silicon layer for the base region 30 adversely increases due to the oxide layer 60. Such an increase in the contact resistance may increase dispersion of current gains and 1/f noise and cause a voltage drop in the operation of the bipolar device. Accordingly, a method of removing the oxide layer 60 is needed.

Referring to FIG. 2, a polysilicon layer for the emitter region 40 is formed to contact a single crystalline silicon layer for the base region 30. Thus, Si-rearrangement may unfortunately occur in an interface 35 between the polysilicon layer 40 and the single crystalline silicon layer 30. The Si-rearrangement may occur while the polysilicon layer is being deposited to fill the contact hole 51 formed in spacers 50 or during a subsequent thermal process.

The Si-rearrangement refers to a phenomenon that silicon atoms in a contact area between the silicon crystalline silicon layer 30 and the polysilicon layer 40 are rearranged in the same arrangement as single crystalline atoms. Thus, a single crystalline silicon region grows in the polysilicon layer 40. As a result, the thickness of the single crystalline silicon layer 30 becomes thicker in the same manner as when the single crystalline silicon layer 30 is re-grown.

By the Si-rearrangement, when a bipolar transistor operates, the effective emitter region 40 decreases and the effective base region 30 expands. This reduces current gains in the bipolar transistor, thus lowering the hFE value of the resulting transistor. For this reason, the Si-rearrangement must be prevented.

SUMMARY OF THE INVENTION

The present invention provides a method of manufacturing a bipolar device. Before a polysilicon layer is formed on a single crystalline silicon layer, this method can effectively remove an undesired oxide layer, which may be formed on the single crystalline silicon layer during a process of forming a contact hole that selectively exposes the single crystalline silicon layer. Also, this method can effectively prevent single crystalline silicon atoms from re-growing due to Si-rearrangement in an interface between the single crystalline silicon layer and the polysilicon layer, so as not to reduce the area of an emitter region.

According to one aspect of the present invention, there is provided a method of manufacturing a bipolar device, the method comprising pre-treating a surface of a single crystalline silicon layer using germane ($GeH_4$) gas before a polysilicon layer is formed on the single crystalline silicon layer.

The method comprises forming a single crystalline silicon layer for a base region on a collector region; forming a polysilicon layer for an emitter region on the single crystalline silicon layer; and pre-treating the surface of the single crystalline silicon layer using germane gas before forming the polysilicon layer.

In one embodiment, the method further comprises forming spacers on the single crystalline silicon layer to have a contact hole that exposes a portion of the single crystalline silicon layer. The germane gas reacts on an undesired layer that may be formed on the exposed portion of the single crystalline silicon layer during the forming of the contact hole, thus removing the oxide layer. This allows the polysilicon layer to fill the contact hole and directly contact the single crystalline silicon layer.

In another aspect, the method of the present invention comprises forming a single crystalline silicon layer for a base region on a collector region; forming a polysilicon layer for an emitter region on the single crystalline silicon layer; and pre-treating the surface of the single crystalline silicon layer using germane gas before forming the polysilicon layer, such that a layer containing germanium (Ge) is formed between the single crystalline silicon layer and the polysilicon layer.

The method can further comprise forming spacers on the single crystalline silicon layer to have a contact hole that exposes a portion of the single crystalline silicon layer. The germane gas reacts on an undesired oxide layer that may be formed on the exposed portion of the single crystalline silicon layer during the forming of the contact hole, thus removing the oxide layer. Further, the germane gas may be used to form the layer containing germanium (Ge).

The pre-treating of the single crystalline silicon layer using the germane gas and the forming of the polysilicon layer can be performed in situ, i.e., at the same location of the same deposition apparatus and in the same range of temperature. Here, temperature may range from about 500° C. to 700° C. The germane gas may be diluted with hydrogen gas .

The layer containing germanium (Ge) may be formed on the single crystalline silicon layer in an island shape or in a continuously layered shape. The method of the present invention may further comprise growing a capping single crystalline silicon layer on the single crystalline silicon layer by doping impurity ions of which conductivity type is opposite to that of the base region.

A bipolar device manufactured by the method of the present invention comprises a collector region; a base region formed using a single crystalline silicon layer on the collector region; an emitter region formed using a polysilicon layer on the base region; and a layer containing germanium (Ge) formed in an interface region between the single crystalline silicon layer and the polysilicon layer.

According to the present invention, when a polysilicon layer is formed on a single crystalline silicon layer, an oxide layer formed therebetween can be easily removed. Also, a layer containing germanium (Ge) is formed in an interface between the single crystalline silicon layer and the polysilicon layer, thus preventing single crystalline silicon atoms from rearranging or re-growing in the polysilicon layer. As a result, the present invention improves the characteristics of a bipolar device.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
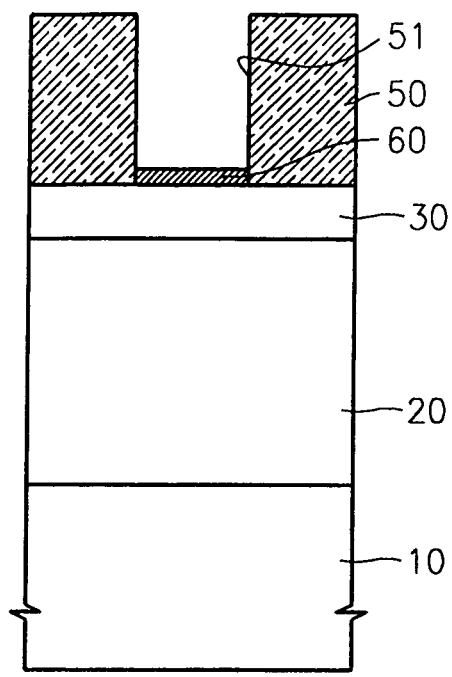
FIG. 1 is a schematic cross-sectional view of a typical bipolar device in which an undesired oxide layer is formed.

The present invention will now be described more fully with reference to the accompanying drawings, in which a exemplary embodiment of the invention is shown. This invention may, however, be embodied in many different forms and should not be construed as being limited to the embodiment set forth herein. In the drawings, the thicknesses of layers may be exaggerated for clarity.

In the embodiments of the present invention, before a second emitter region formed of a polysilicon layer is formed on a base region and/or a first emitter region, which are formed of a single crystalline silicon layer and constitute a bipolar transistor, pre-treatment using germane gas on the single crystalline silicon layer followed by deposition of the polysilicon layer is preferably performed in situ. By the pre-treatment using the germane gas, an undesired oxide layer can be effectively removed from the surface of the single crystalline silicon layer. Also, this pre-treatment may be performed for a longer duration of time, thus leaving a thin or island-shaped germanium (Ge) layer on the surface of the single crystalline silicon layer.

Hereinafter, a bipolar transistor, in a base region and a first emitter region, which are formed of a single crystalline silicon layer, are sequentially stacked and a second emitter region formed of a polysilicon layer is then formed, will be described. Preferably, the single crystalline silicon layer contacts the polysilicon layer in the bipolar transistor.

EMBODIMENT 1

Figure 3:
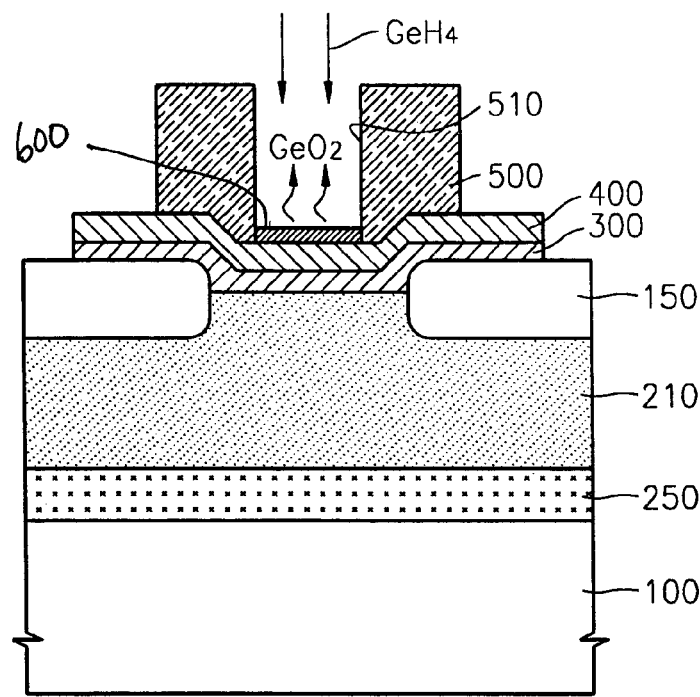
FIGS. 3 and 4 are schematic cross-sectional views illustrating a method of manufacturing a bipolar device according to a first embodiment of the present invention.
Figure 4:
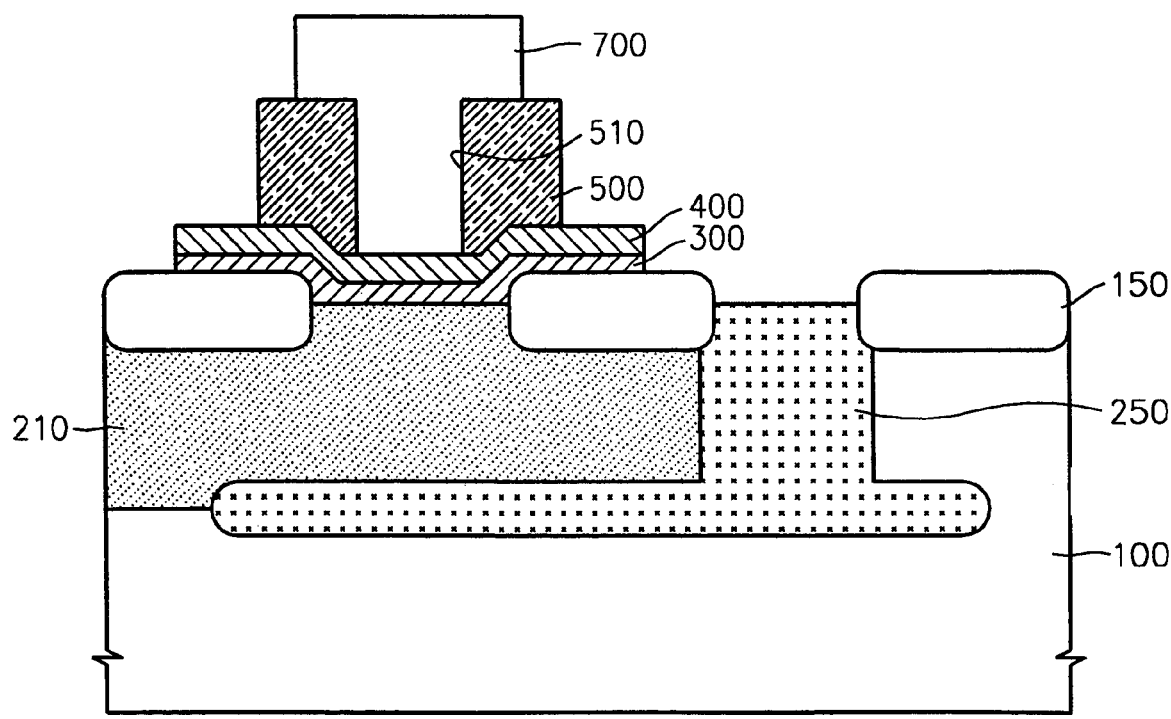

FIGS. 3 and 4 are schematic cross-sectional views illustrating a method of manufacturing a bipolar device according to a first embodiment of the present invention. Referring to FIGS. 3 and 4, a bipolar transistor comprises first and second collector regions 210 and 250, a base region 300, and an emitter region 700, which are stacked on a silicon substrate 100. Specifically, as shown in FIG. 3, the collector regions 210 and 250 are preferably formed by doping impurity ions into the silicon substrate 100. Here, if the bipolar transistor is an npn-type transistor, the collector regions 210 and 250 are formed by doping n-type impurity ions, such as P and As.

While the first collector region 210 is a lightly doped region, the second collector region 250 is a heavily doped region. For example, the first collector region 210 and the second collector region 250 may be an n-collector region and an $n^+$-collector region, respectively. As shown in FIG. 4, the second collector region 250 extends to the surface of the substrate 100 and is connected to a collector electrode (not shown). An isolation region 150 is formed on the substrate 100 and defines individual bipolar transistors. A single crystalline silicon layer is grown by epitaxial growth on the collector regions 210 and 250, which are exposed by the isolation region 150, thereby forming a base region 300. Here, the base region 300 is formed by doping impurity ions of which conductivity type is opposite to that of the collector regions 210 and 250. For example, the base region 300 may be a p-base region by doping impurity ions, such as boron (B), into the single crystalline silicon layer.

A capping silicon layer 400 may be further formed on the base region 300. The capping silicon layer 400 may function as a junction in an interface between the base region 300 and an emitter region (700 of FIG. 4). The capping silicon layer 400 also may be formed of single crystalline silicon by doping impurity ions of which conductivity type is opposite to that of the base region 300, for example, n-type impurity ions, at a lower concentration than in the emitter region (700 of FIG. 4).

Thereafter, spacers 500 are formed to have a contact hole 510, which exposes a portion of the single crystalline silicon layer for the base region 300. If the capping silicon layer 400 is adopted, the contact hole 510 exposes a portion of the single crystalline silicon layer for the capping silicon layer 400 instead of the base region 300.

The spacers 500 can be formed of silicon nitride or silicon oxide. As described above, when the surface of the single crystalline silicon layer, i.e., the base region 300 or the capping silicon layer 400 as shown in FIG. 3, is exposed by the contact hole 510, an undesired oxide layer 600, i.e., a natural oxide layer or a residual oxide layer, may be disposed thereon to a thickness of about 10 Å to 20 Å. This oxide layer 600 is preferably removed to prevent degradation of the characteristics of the bipolar transistor, as described with reference to FIG. 1.

To remove the oxide layer 600, before a polysilicon layer for an emitter region (700 of FIG. 4) is deposited to fill the contact hole 510, the surface of the exposed single crystalline silicon layer (400 of FIG. 3) is pre-treated using germane (GeH$_4$) gas. This pre-treatment and subsequent deposition of a polysilicon layer are preferably performed in situ.

When the germane gas is activated, it reacts on silicon oxide as shown in Chemical reaction formula (1), generating germanium dioxide (GeO$_2$) so as to remove the silicon oxide.

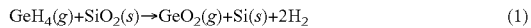
$$\text{GeH}_4(g)+\text{SiO}_2(s)\rightarrow\text{GeO}_2(g)+\text{Si}(s)+2\text{H}_2 \quad (1)$$

As shown in the formula 1, by the pre-treatment using the germane gas, the oxide layer 600 is effectively removed from the bottom of the contact hole 510, i.e., the exposed surface of the single crystalline silicon layer 400.

Referring to FIG. 4, after the pre-treatment is performed to remove the oxide layer 600, a polysilicon layer for an emitter region 700 is deposited to fill the contact hole 510. The emitter region 700 is preferably an n$^+$-emitter region obtained by doping high-concentration impurity ions. Thus, a polysilicon layer is deposited by doping phosphorous ions or arsenic ions at a high concentration of about 1 e20/cm$^3$ or higher so as to form the emitter region 700.

The polysilicon layer for the emitter region 700 is deposited using a tube furnace or a single-wafer-type CVD apparatus. Here, the deposition process is carried out using a mixture of SiH$_4$ gas with one of PH$_4$ gas and AsH$_3$ gas instead of PH$_4$ gas as a reaction gas at a temperature of 500° C. to 700° C. under a pressure of about 10 mTorr to 100 Torr.

The pre-treatment using germane gas can be performed in situ in an apparatus to be used for forming the polysilicon layer. That is, conditions used in forming the polysilicon layer are held constant, and the germane gas is injected in a hydrogen atmosphere of about 10 ppm to 100 ppm for about 5 minutes or less. Then, the oxide layer 600 formed on the silicon substrate 100 is effectively removed. Since the pre-treatment is performed in the same apparatus as when the polysilicon layer is formed, an additional chamber or the like is not required, thus facilitating the pre-treatment.

The pre-treatment can constantly hold contact resistance between the polysilicon layer for the emitter region 700 and the single crystalline silicon layer 400 for the base region 300 (or the capping silicon layer 400). The oxide layer (600 of FIG. 3) may increase not only the contact resistance but also the dispersion of current gains in the bipolar device. Accordingly, if the oxide layer 600 is removed, the dispersion of current gains can be minimized in the bipolar device. This facilitates mass production of bipolar devices.

EMBODIMENT 2

Figure 5:
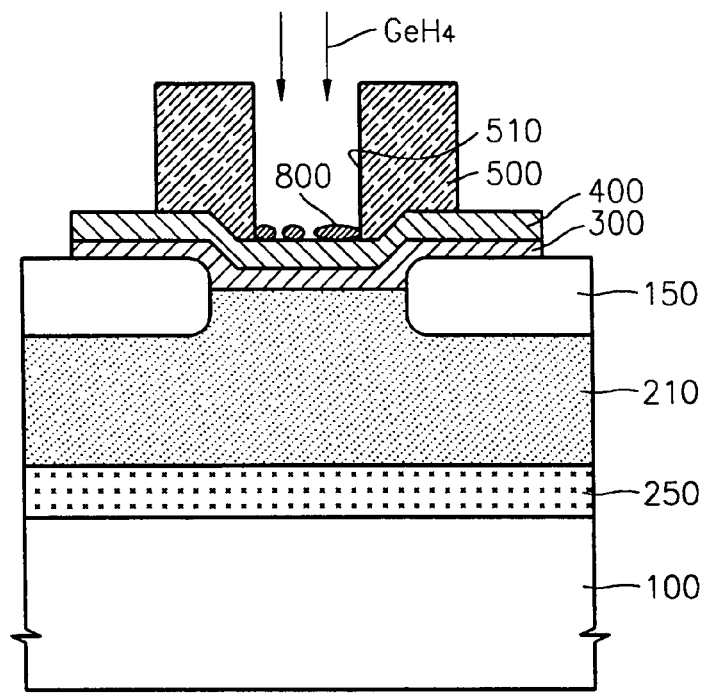
FIGS. 5 and 6 are schematic cross-sectional views illustrating a method of manufacturing a bipolar device according to a second embodiment of the present invention.
Figure 6:
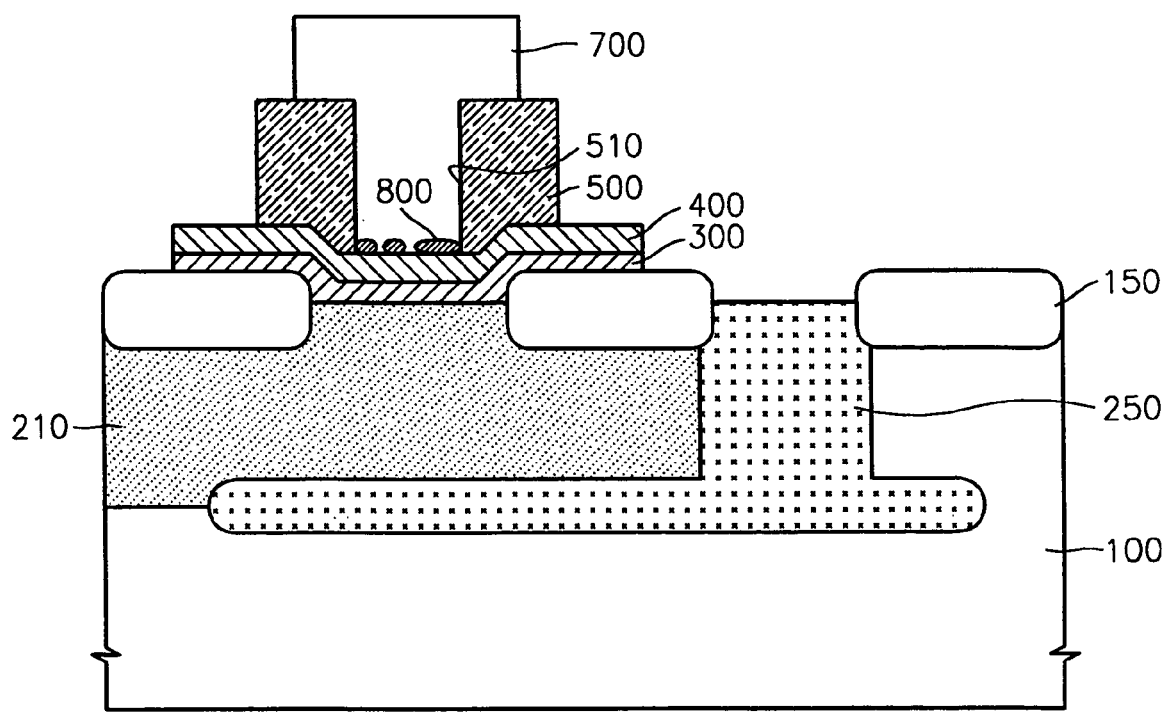

FIGS. 5 and 6 are schematic cross-sectional views illustrating a method of manufacturing a bipolar device according to a second embodiment of the present invention.

Referring to FIGS. 5 and 6, the pre-treatment using germane gas, as described with reference to FIG. 3 in the first embodiment, is performed for a longer duration of time so as to allow deposition of a germanium layer on a single crystalline silicon layer (400 of FIG. 5) exposed by a contact hole 510.

Specifically, as described with reference to FIG. 3, germane gas is supplied to the single crystalline silicon layer 400 and thus reacts on the oxide layer (600 of FIG. 3), as shown in the formula (1). Thus, the oxide layer 600 is removed. If the supply of the germane gas continues, silicon oxide constituting the oxide layer 600 is entirely removed and then the germane gas directly reacts on the single crystalline silicon layer 400. After the oxide layer 600 is entirely removed, the germane gas does not show the reaction as shown in the formula (1) any more. Instead, a germanium layer 800 is deposited on the exposed single crystalline silicon layer 400.

Figure 2:
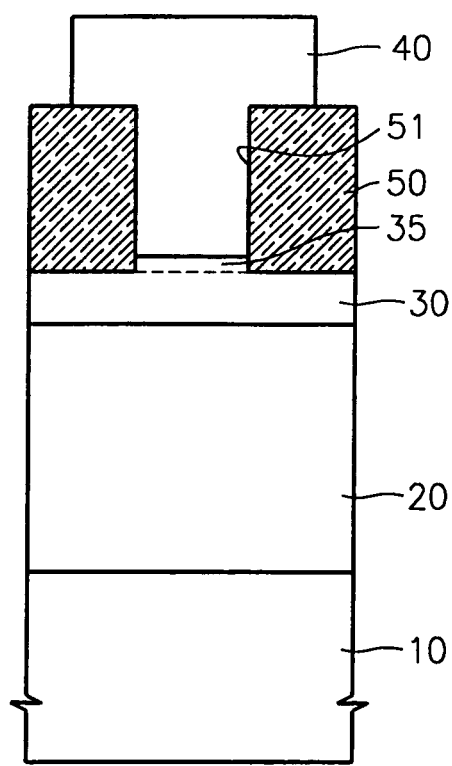
FIG. 2 is a schematic cross-sectional view of a typical bipolar device in which undesired Si-rearrangement occurs.

By deliberately forming the germanium layer 800, the bipolar device has advantages. As described with reference to FIG. 2, Si-rearrangement may occur in an interface between the polysilicon layer (40 of FIG. 2) and the single crystalline silicon layer (30 of FIG. 2) due to the deposition of the polysilicon layer (40 of FIG. 2) for the emitter region or a subsequent process. As describe above, the Si-rearrangement may cause undesired effects when the bipolar device operates, i.e., when high-voltage current is supplied. Thus, the area of the effective emitter region (40 of FIG. 2) may decrease or the effective base region may extend.

However, as shown in FIG. 5, through the pre-treatment using the germane gas, the oxide layer (600 of FIG. 3) can be removed and the germanium layer 800 can be formed on the cleaned single crystalline silicon layer (400 of FIG. 5). As a result, the germanium layer 800 exists in the interface between the polysilicon layer for the emitter region 700 and the single crystalline silicon layer for the base region 300 or the capping silicon layer 400. The germanium layer 800 may be formed in an island shape or in a continuously layered shape to a very thin thickness.

The germanium layer 800, disposed between the polysilicon layer (700 of FIG. 6) and the single crystalline silicon layer (300 and 400 of FIG. 6), can prevent the Si-rearrangement. That is, the germanium layer 800 prevents single crystalline silicon from re-growing in the polysilicon layer 700.

Thus, when the bipolar device operates, the area of the emitter region (40 of FIG. 2) does not decrease and the base region (30 of FIG. 2) does not expand. As a result, a reduction in current gains can be prevented.

As explained thus far, before a polysilicon layer for an emitter region is formed in a bipolar device, pre-treatment using germane gas is carried out to effectively clean the surface of a single crystalline silicon layer for a base region and/or a capping silicon layer, which is disposed under the polysilicon layer. The pre-treatment using germane gas can be performed in situ in the same apparatus as when the polysilicon layer will be formed. Thus, an additional apparatus is not required, thus facilitating the pre-treatment.

By the pre-treatment using germane gas, a natural oxide layer or a residual oxide layer can be removed from the surface of the single crystalline silicon layer. Thus, an increase in contact resistance between the single crystalline silicon layer and the polysilicon layer can be prevented. Also, an increase in dispersion of current gains or an increase in 1/f noise can be suppressed in a bipolar device.

Alternatively, the pre-treatment using germane gas may be performed for a longer duration of time. Thus, the undesired oxide layer can be removed and a germanium layer is formed so as to prevent Si-rearrangement or re-growth of single crystalline silicon in the polysilicon layer. This can prevent a reduction of current gains in the bipolar device.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a bipolar device, the method comprising:

forming a single crystalline silicon layer for a base region on a collector region;

forming a polysilicon layer for an emitter region on the single crystalline silicon layer;

pre-treating the surface of the single crystalline silicon layer using germane gas before beginning forming the polysilicon layer; and growing a capping single crystalline silicon layer by doping impurity ions the conductivity type of which is opposite to that of the base region.

2. The method of claim 1, further comprising:

forming spacers on the single crystalline silicon layer to have a contact hole that exposes a portion of the single crystalline silicon layer, wherein the germane gas reacts on an undesired oxide layer, which is formed on the exposed portion of the single crystalline silicon layer during the forming of the contact hole, to remove the undesired oxide layer such that the polysilicon layer fills the contact hole and directly contacts the single crystalline silicon layer.

3. The method of claim 1, wherein the pre-treating of the single crystalline silicon layer using the germane gas and the forming of the polysilicon layer are performed in situ.

4. The method of claim 1, wherein the pre-treating of the single crystalline silicon layer using the germane gas and the forming of the polysilicon layer are performed at the same location of the same deposition apparatus and in the same range of temperature.

5. The method of claim 4, wherein temperature ranges from about 500° C. to 700° C.

6. The method of claim 4, wherein the germane gas is diluted with hydrogen gas.

7. The method of claim 1, wherein the capping single crystalline silicon layer is doped with impurity ions having a conductivity type is the same as that of the emitter region.

8. A method of manufacturing a bipolar device, the method comprising:

forming a single crystalline silicon layer for a base region on a collector region;

forming a polysilicon layer for an emitter region on the single crystalline silicon layer; and pre-treating the surface of the single crystalline silicon layer using germane gas before beginning forming the polysilicon layer, such that a layer containing germanium is formed between the single crystalline silicon layer and the polysilicon layer.

9. The method of claim 8, further comprising:

forming spacers on the single crystalline silicon layer to have a contact hole that exposes a portion of the single crystalline silicon layer, wherein the germane gas reacts on an undesired oxide layer, which is formed on the exposed portion of the single crystalline silicon layer during the forming of the contact hole, to remove the undesired oxide layer and is used to form the layer containing germanium.

10. The method of claim 8, wherein the pre-treating of the single crystalline silicon layer using the germane gas and the forming of the polysilicon layer are performed in situ.

11. The method of claim 8, wherein the pre-treating of the single crystalline silicon layer using the germane gas and the forming of the polysilicon layer are performed at the same location of the same deposition apparatus and in the same range of temperature.

12. The method of claim 11, wherein temperature ranges from about 500° C. to 700° C.

13. The method of claim 8, wherein the germane gas is diluted with hydrogen gas.

14. The method of claim 8, the layer containing germanium is formed on the single crystalline silicon layer in an island shape or in a continuously layered shape.

15. The method of claim 8, further comprising growing a capping single crystalline silicon layer by doping impurity ions the conductivity type of which is opposite to that of the base region.

* * * * *